(12) United States Patent
Aoki et al.

(10) Patent No.: US 10,122,088 B2
(45) Date of Patent: Nov. 6, 2018

(54) COLLECTIVE LAMINATION SUBSTRATE FORMING PSEUDO WAVEGUIDE

(71) Applicant: DENSO CORPORATION, Kariya, Aichi-pref. (JP)

(72) Inventors: Kazuhiro Aoki, Kariya (JP); Shinichiro Matsuzawa, Nagakute (JP)

(73) Assignee: DENSO CORPORATION, Kariya, Aichi-pref. (JP)

( * ) Notice: Subject to any disclaimer, the term of this patent is extended or adjusted under 35 U.S.C. 154(b) by 295 days.

(21) Appl. No.: 15/112,998

(22) PCT Filed: Jan. 21, 2015

(86) PCT No.: PCT/JP2015/051495
§ 371 (c)(1),
(2) Date: Jul. 20, 2016

(87) PCT Pub. No.: WO2015/111609
PCT Pub. Date: Jul. 30, 2015

(65) Prior Publication Data
US 2016/0336654 A1     Nov. 17, 2016

(30) Foreign Application Priority Data

Jan. 21, 2014 (JP) .................................. 2014-008570

(51) Int. Cl.
*H01Q 1/38* (2006.01)
*H01Q 5/55* (2015.01)
(Continued)

(52) U.S. Cl.
CPC ............... *H01Q 5/55* (2015.01); *H01P 3/121* (2013.01); *H01P 3/16* (2013.01); *H01P 5/087* (2013.01);
(Continued)

(58) Field of Classification Search
CPC ...... H01Q 5/55; H01Q 21/0093; H01Q 9/045; H01Q 9/0407; H01Q 1/48; H05K 1/0218;
(Continued)

(56) References Cited

U.S. PATENT DOCUMENTS 6,239,669 B1    5/2001   Koriyama et al.
6,356,173 B1 *   3/2002   Nagata .................... H01L 23/66
                                                    257/664
(Continued)

FOREIGN PATENT DOCUMENTS

JP         11-112209 A      4/1999
JP        2007043643 A     2/2007
(Continued)

*Primary Examiner* — Khai M Nguyen
(74) *Attorney, Agent, or Firm* — Knobbe, Martens, Olson & Bear, LLP

(57) ABSTRACT

A collective lamination substrate N is provided with pattern layers having N number of layers, where N is an integer and 4 or more, a pseudo waveguide formed penetrating through the pattern layers in a lamination direction, a converter section formed in the pattern layers, mutually converting between an electrical signal and radio waves being transmitted and received via the pseudo waveguide, and ground patterns formed in the pattern layers, covering a periphery of a waveguide formation section. The collective lamination substrate further includes: antennas formed in the waveguide formation section; a first via group provided in a periphery of the waveguide formation section; and a second via group provided in a periphery of the waveguide formation section and positioned at a more outer portion than the first via group.

7 Claims, 8 Drawing Sheets

(51) Int. Cl.
  *H01P 5/107* (2006.01)
  *H01P 3/12* (2006.01)
  *H01P 3/16* (2006.01)
  *H01P 5/08* (2006.01)
  *H01Q 1/48* (2006.01)
  *H01Q 9/04* (2006.01)
  *H05K 1/11* (2006.01)
  *H01Q 21/00* (2006.01)
  *H05K 1/02* (2006.01)

(52) U.S. Cl.
  CPC ............... *H01P 5/107* (2013.01); *H01Q 1/48* (2013.01); *H01Q 9/045* (2013.01); *H01Q 9/0407* (2013.01); *H01Q 21/0093* (2013.01); *H05K 1/0218* (2013.01); *H05K 1/0239* (2013.01); *H05K 1/115* (2013.01); *H05K 2201/09363* (2013.01); *H05K 2201/09618* (2013.01)

(58) Field of Classification Search
  CPC .......... H05K 1/0239; H05K 1/115; H05K 2201/09363; H05K 2201/09618; H01P 5/087; H01P 3/16; H01P 3/121; H02P 5/107
  USPC ................................................ 343/700 MS
  See application file for complete search history.

(56) References Cited

U.S. PATENT DOCUMENTS

| 2007/0262828 | A1 | 11/2007 | Fujita |
| 2010/0090903 | A1* | 4/2010 | Byun ............... H01Q 9/0407 343/700 MS |
| 2012/0050131 | A1 | 3/2012 | Hashimoto et al. |

FOREIGN PATENT DOCUMENTS

| JP | 2007-329908 A | 12/2007 |
| JP | 2011-239258 A | 11/2011 |

* cited by examiner

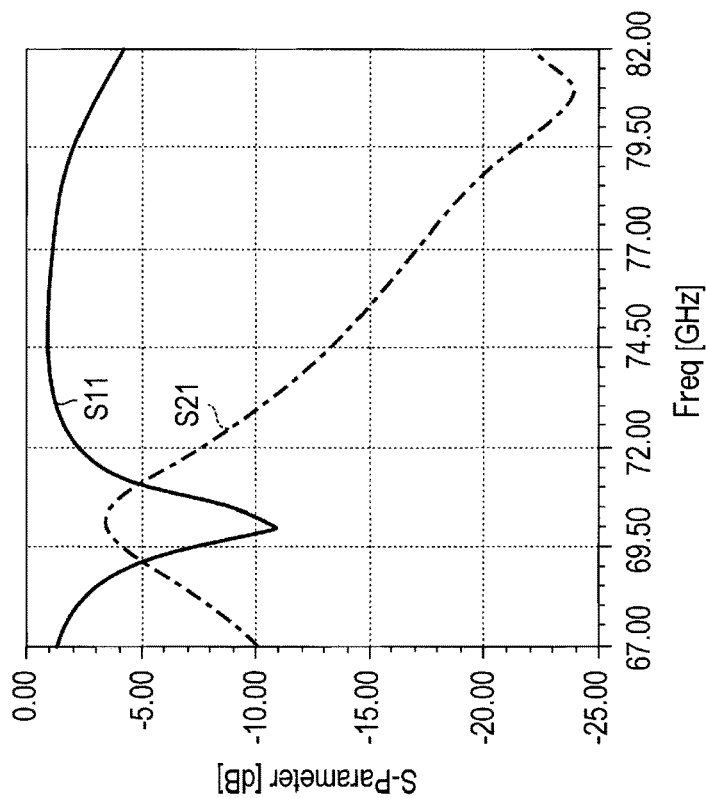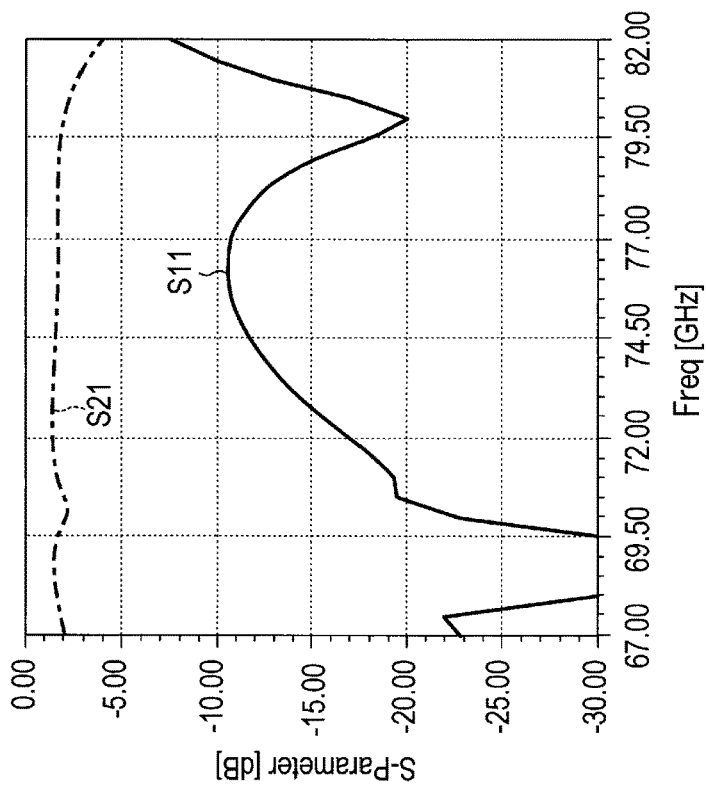

COLLECTIVE LAMINATION SUBSTRATE FORMING PSEUDO WAVEGUIDE

CROSS-REFERENCE TO RELATED APPLICATION

This application is based on and claims the benefit of priority from earlier Japanese Patent Application No. 2014-8570 filed Jan. 21, 2014, the description of which is incorporated herein by reference.

BACKGROUND OF THE INVENTION

Technical Field

The present disclosure relates to a technique for transmitting a signal using a collective lamination substrate, and particularly to a technique for transmitting a signal by using a pseudo waveguide formed on a collective lamination substrate.

Background

Techniques using a low-loss hollow waveguide are known for transmitting a signal from one side surface of a substrate to the other side surface thereof. For example, international publication number 2010/125835 discloses an antenna apparatus including a first substrate where a hollow waveguide is provided and a second substrate where an antenna is provided. The antenna apparatus is manufactured by joining the first and second substrates.

CITATION LIST

Patent Literature

[PTL 1] WO 2010/125835

According to conventional techniques, there has been a problem that two substrates are attached so that the manufacturing processes become more complex, and characteristics of the apparatus are likely to vary depending on assembly errors during the manufacturing.

As a technique to simplify the structure, international publication number 2010/125835 also discloses use of a pseudo waveguide in a collective lamination substrate, which is surrounded by via holes instead of a hollow waveguide. However, since inside the waveguide of the pseudo waveguide is filled with dielectric, a problem arises that loss increases and lowers the transmission efficiency, compared to the hollow waveguide.

SUMMARY

Hence it is desired to provide a technique which lowers transmission loss in the signal transmission using a pseudo waveguide formed in the collective lamination substrate.

A collective lamination substrate according to the present disclosure includes pattern layers laminated in N-layers, where N is an integer and 4 or more, each of the pattern layers being laminated alternately with a dielectric layer, and a pseudo waveguide is formed penetrating through the pattern layers in a lamination direction in which the pattern layers are laminated. A transmission line and a converter section which are formed in a first layer and Nth layer located at outermost layers of the pattern layers in the lamination direction, the converter section mutually converting between an electrical signal flowing through the transmission line and radio waves being transmitted and received via the pseudo waveguide. Ground patterns are formed at portions from a second layer to an N−1 th layer in the pattern layers, at least covering a periphery of a waveguide formation section which is an electrical opening to form the pseudo waveguide. Antennas are formed at portions corresponding to the second and the N−1 th layers in the waveguide formation section.

A first via group is provided in a periphery of the waveguide formation section, composed of a plurality of vias that establish conduction between a ground pattern formed in the first layer of the pattern layers and a ground pattern formed in the second layer of the pattern layers, and a plurality of vias that establish conduction between a ground pattern formed in the N−1 th layer of the pattern layers and a ground pattern formed in an N th layer of the pattern layers. Also, a second via group is provided in a periphery of the waveguide formation section and positioned at a more outer portion than the first via group, the second via group being composed of a plurality of vias that establish conduction through the ground patterns formed at the portions from the second layer to the N−1 th layer.

In other words, vias forming the pseudo waveguide form a doubled circular structure in a periphery of the waveguide formation section, when viewing from a lamination direction of the collective lamination substrate (direction perpendicular to the substrate surface).

According to these configurations, transmission loss in the pseudo waveguide can be minimized.

The present disclosure can be achieved with various modifications, other than the above described collective substrate, such as various apparatuses using the collective lamination substrate as an element.

BRIEF DESCRIPTION OF DRAWINGS

In the accompanying drawings:

FIG. 6A is a graph showing a reflection loss and an insertion loss calculated by a simulation according to the present embodiment;

FIG. 6B is a graph showing a reflection loss and an insertion loss calculated by a simulation according to a comparative example;

DETAILED DESCRIPTION OF PREFERRED EMBODIMENTS

Hereinafter, with reference to the drawings, an antenna apparatus according to an embodiment of the present disclosure will be described.

<Overall Configuration>

Figure 1:
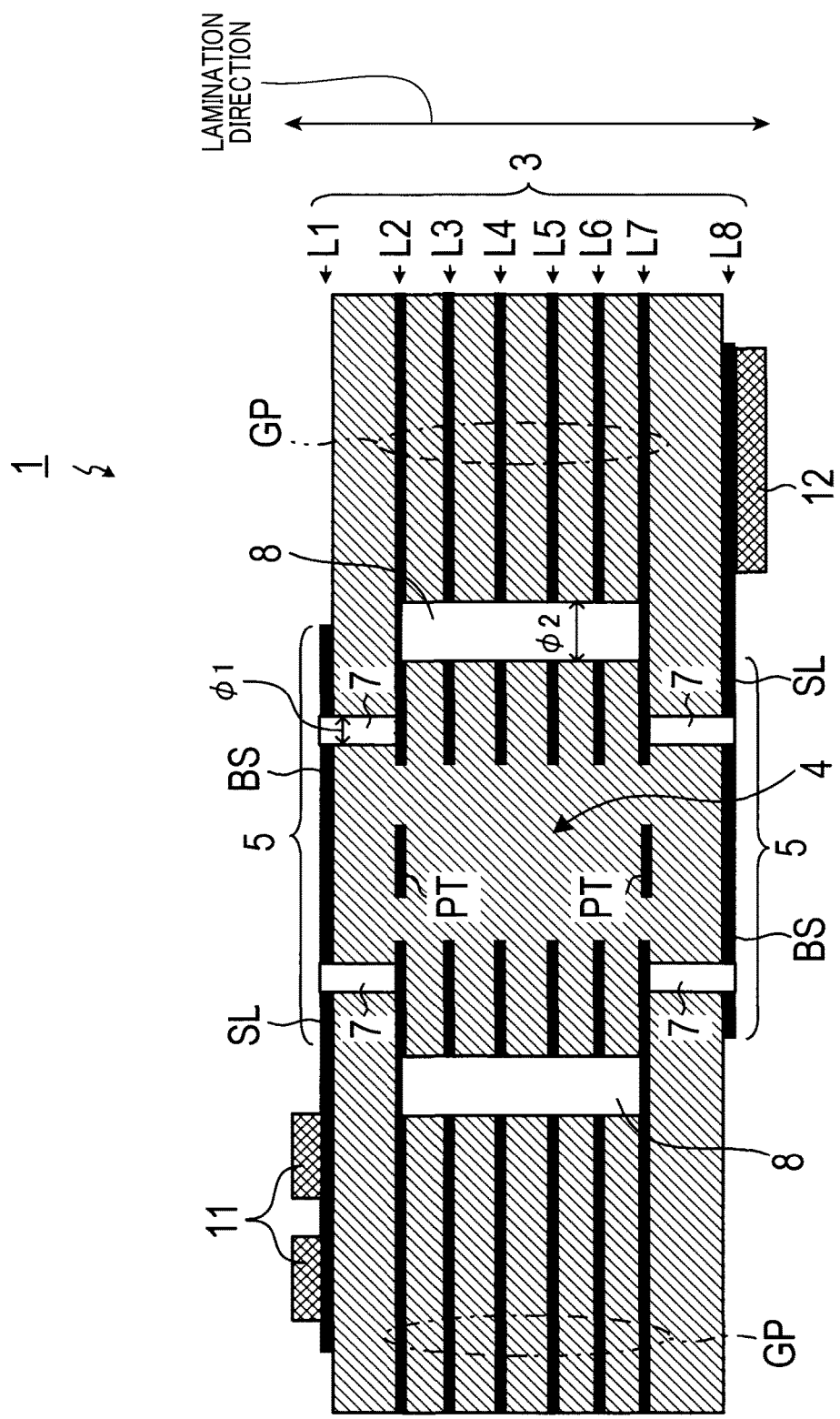
FIG. 1 is a cross section showing a structure of a collective lamination substrate configuring an antenna apparatus.

As shown in FIG. 1, an antenna apparatus 1 is configured of a collective lamination substrate 3 having 8 pattern layers L1 to L8 formed to sandwich 7 dielectric layers. In the following, among the pattern layers L1 to L8, the pattern layers L1 and L8 located at outer most layers in a lamination direction of the substrate is defined as outer layers, and other pattern layers L2 to L7 are defined as inner layers.

For the collective lamination substrate 3, PALUP (Patterned Prepreg Lay up Process) substrate is used, for example. The PALUP substrate is a known multi-layered substrate, in which a wiring pattern made of copper foil is formed on a surface of a substrate made of thermoplastic resin by etching, and a predetermined number of base materials after the pattern-forming are laminated and hot-pressed so as to form a multi-layered structure. A pseudo waveguide 4 is formed in the collective lamination substrate 3 to transmit a signal between the outer layers L1 and L8. The outer layers L1 and L8, and the inner layers L2 and L7 adjacent to the outer layers L1 and L8, are electrically connected by a first via group 7. The inner layers L2 to L7 are electrically connected by a second via group 8. Vias each having a diameter φ1 in the first via group 7 are disposed in a circular shape, surrounding the periphery of the pseudo waveguide 4. Vias each having a diameter φ2 (>φ1) in the second via group 8 are disposed, in a circular shape, at a more outer portion than the first via group 7 surrounding the periphery of the pseudo waveguide 4. In other words, the first via group 7 and the second via group 8 form a doubled circular structure.

<Outer Layer>

Figure 2:
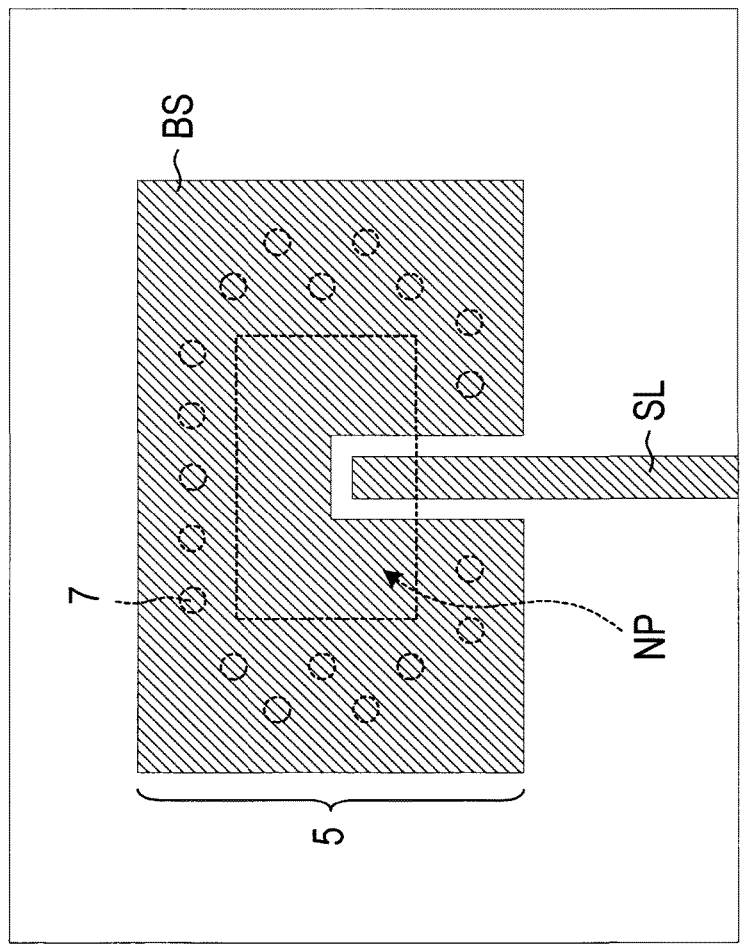
FIG. 2 is an explanatory diagram showing a structure in the vicinity of a conversion section of an outer layer.

The outer layers L1 and L8 have converter sections 5, 5 each transmitting/receiving a signal via the pseudo waveguide 4. The converter section 5 is provided with a microstrip line SL and a back short BS. As shown in FIG. 2, the microstrip line SL is wired such that one end thereof is positioned around the center of a portion (hereinafter is referred to as pseudo waveguide opening) corresponding to an opening end of the pseudo waveguide 4. The back short BS is composed of a rectangular pattern formed covering whole pseudo waveguide opening. The back short BS has a shape where a pattern around the microstrip line is removed to avoid touching the microstrip line. One ends of the vias in the first via group 7 are connected to the back short BS.

Figure 5:
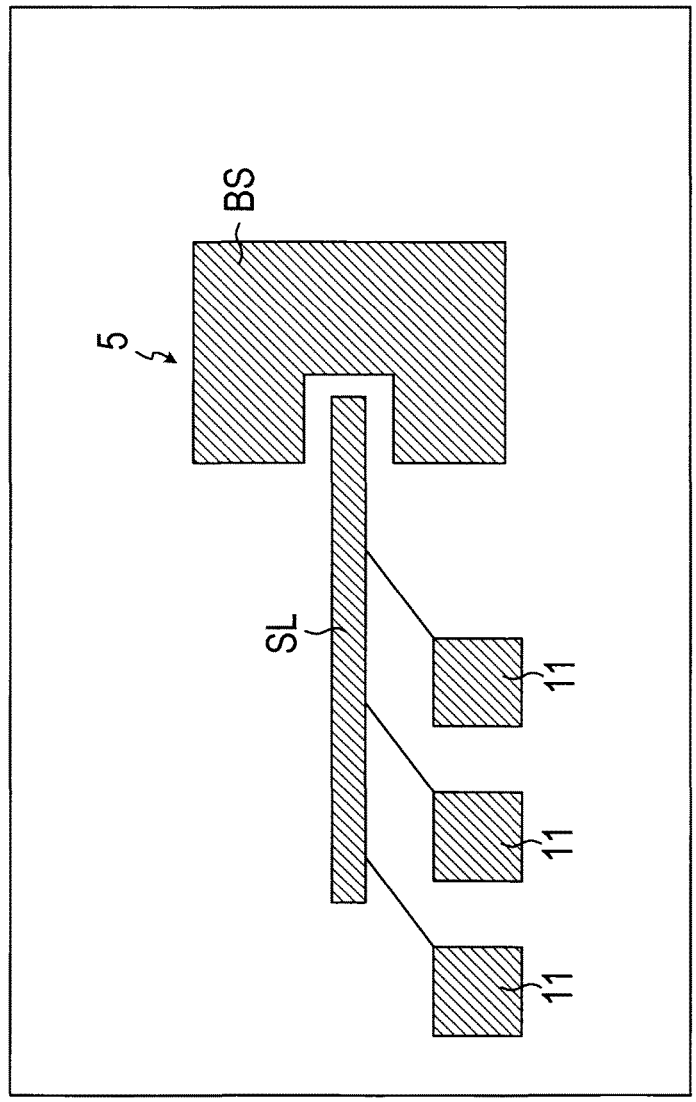
FIG. 5 is an explanatory diagram showing an overall structure of the outer layer.

As shown in FIGS. 1 and 5, a plurality of antenna elements 11 configured of patch antennas are provided on the outer layer L1. These antenna elements 11 are wired to receive power via the microstrip line SL included in the converter section 5. The outer layer L8 has a circuit element 12 composing a transmission/reception circuit, being wired to transmit and receive a signal via the microstrip line SL composing the converter section 5. Specifically, a high frequency signal outputted from the transmission/reception circuit is supplied to the antenna element 11 via the converter section 5 in the outer layer L8, the pseudo waveguide 4 and the converter section 5 in the outer layer L1. Then, the signal received by the antenna element 11 is supplied to the transmission/reception circuit via the converter section 5 in the outer layer L1, the pseudo waveguide 4 and the converter section 5 in the outer layer L8.

<Inner Layer>

Figure 3:
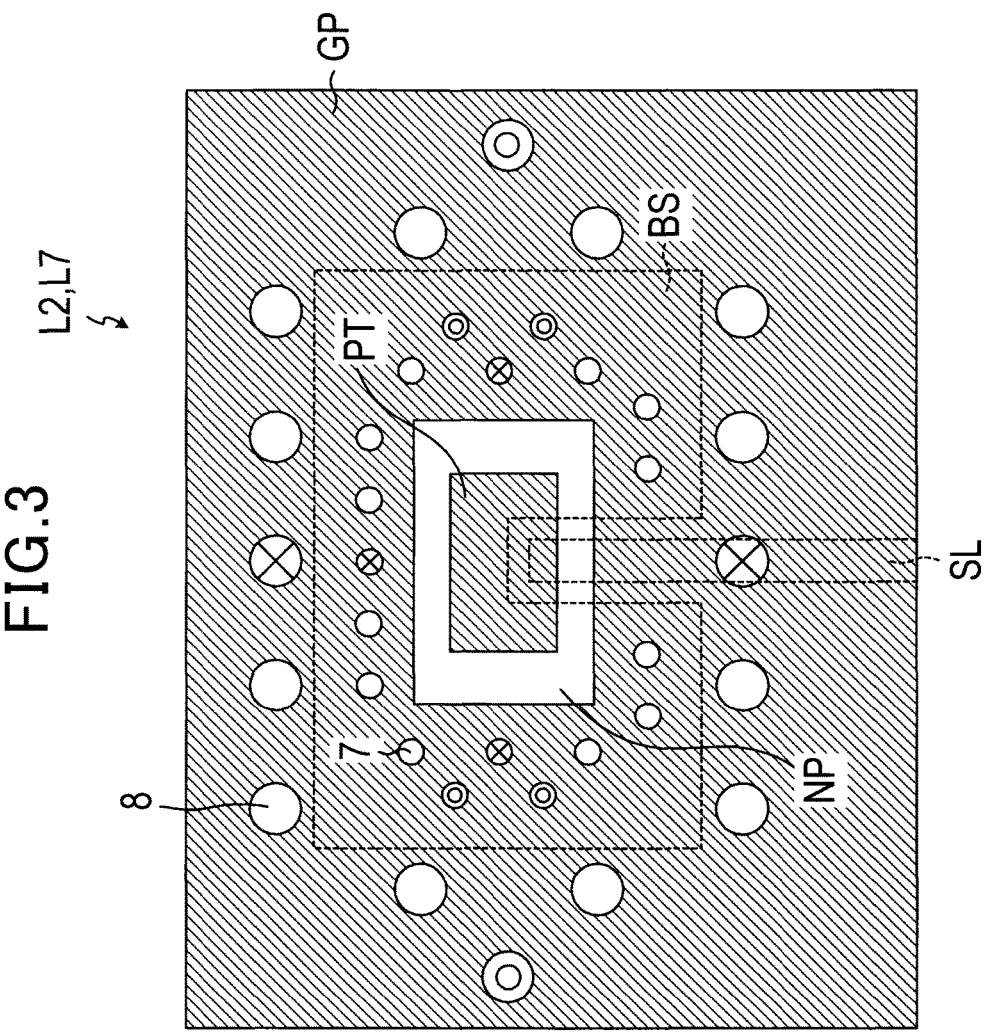
FIG. 3 is an explanatory diagram showing a structure in the vicinity of a waveguide formation section of an inner layer adjacent to the outer layer.
Figure 4:
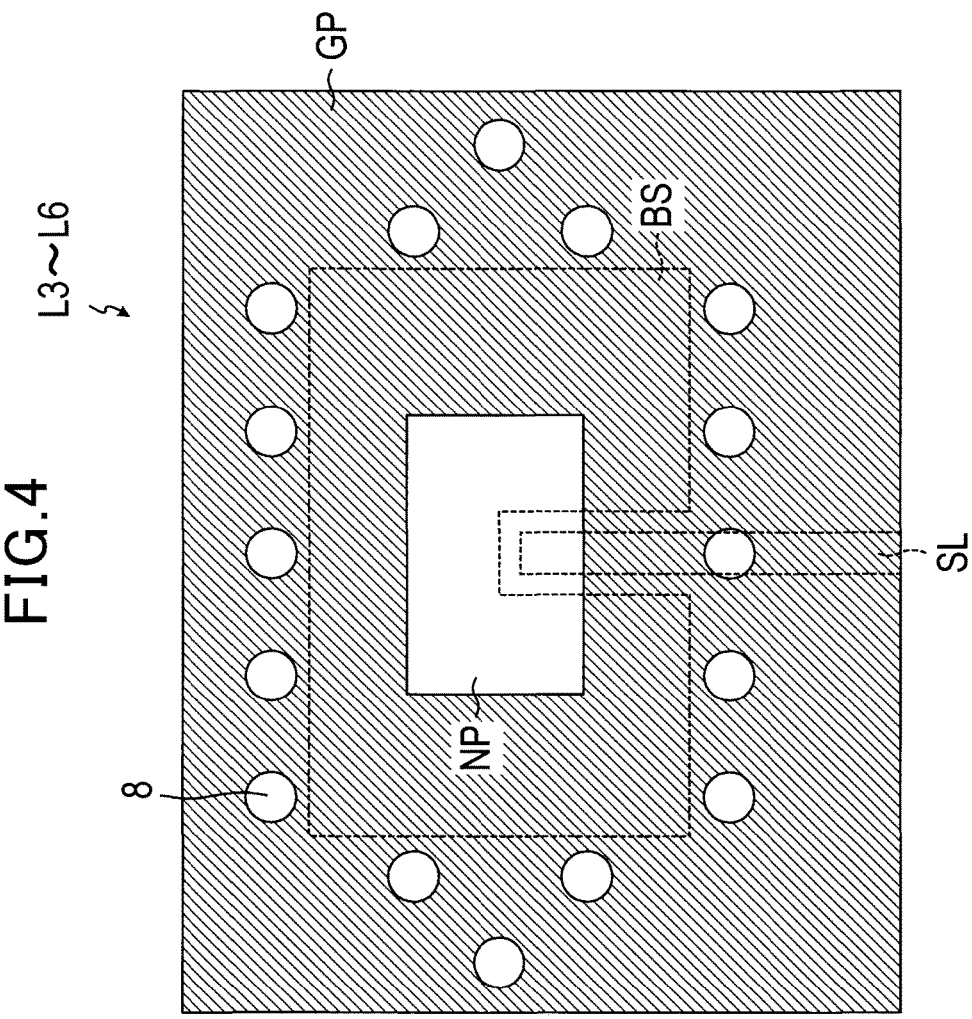
FIG. 4 is an explanatory diagram showing a structure in the vicinity of the waveguide formation section of an inner layer not adjacent to the outer layer.

In the inner layers L2 to L7, as shown in FIG. 1, a ground pattern GP is formed. Especially, resonant patches PT are formed in the inner layers L2 and L7 adjacent to the outer layers L1 and L8. As shown in FIGS. 3 and 4, the ground pattern GP is formed to cover whole periphery of a waveguide formation section NP which is an electrical opening having a rectangular shape to form the pseudo waveguide 4. As shown in FIG. 3, in the waveguide formation section NP, each of the resonant patches PT forms a pattern similar to the shape of the waveguide formation section NP, not touching the ground pattern GP.

All of the ground patterns GP have holes forming vias included in the second via group 8 (portions where no patterns are formed). Further, the ground pattern GP in the inner layers L2 and L7 have holes forming vias included in the first via group 7 (portions where no patterns are formed).

The vias included in the first via group 7 each having a diameter $\varphi 1 = 0.075 \lambda_g$, where $\lambda_g$ is wavelength of radio waves transmitting through the pseudo waveguide 4 (wavelength inside substrate), are arranged at positions $0.135\lambda_g$ away from a boundary of the waveguide formation section NP, excluding an area where the microstrip line SL is wired, with intervals of $0.175\lambda_g$. On the other hand, the vias included in the second via group 8, each having a diameter $\varphi 2 = 0.15\lambda_g$, are arranged at positions $0.4\lambda_g$ away from the boundary of the waveguide formation section NP, with intervals of $0.35\lambda_g$. In other hand, the vias included in the via group 8 have larger diameters than that of the vias included in the first via group, and the intervals are wider than that of the vias included in the first via group.

In both of the first via group 7 and the second via group 8, vias are arranged to be located at a center line along an edge of the waveguide formation section NP, the center line passing through the center of the waveguide formation section NP (refer to vias indicated by X shown in FIG. 3). When the vias cannot be arranged in positions conforming to this condition, vias conforming to this condition are arranged in positions where distances from the boundary of the waveguide formation section NP are larger than that of other vias (refer to vias indicated by a double circle among second via group 8 shown in FIG. 3). Further, vias are arranged at positions known from experiment, where radio waves are effectively prevented from leaking (refer to vias indicated by double circle among first via group 7 shown in FIG. 3).

<Experiment>

As shown in FIG. 6A, a passing loss S21 through the converter section 5 of the outer layer L8 to the converter section 5 of the outer layer L1 and a reflection loss S11 are calculated by a simulation. As a result, when the frequency is 81 GHz or less, it was confirmed that the passing loss was lowered to 2.5 dB or less, and an amount of reflection was lowered to −10 dB or less. It should be noted that FIG. 6B is a comparative example by a simulation without the second via group 8. Specifically, the passing loss S21 and the reflection loss 11 were similarly calculated for vias having single circular structure by a simulation. However, an appropriate adjustment was applied to the shape of the resonant patch PT so as to change the resonant frequency to be higher as much as possible. In this comparative example, it was confirmed that the passing loss S21 became significantly high.

Effects

As described, according to the present embodiment, the vias are arranged to have doubled circular structure, making conduction through the pattern layers L1 to L8 of the collective lamination substrate 3. Thus, a transmission loss in the pseudo waveguide 4 formed in the collective lamination substrate 3 can be suppressed.

Other Embodiments

Embodiments of the present disclosure are described in the above. The present disclosure is not limited to the above-described embodiment. However, various modifications can be made.

Figure 8:
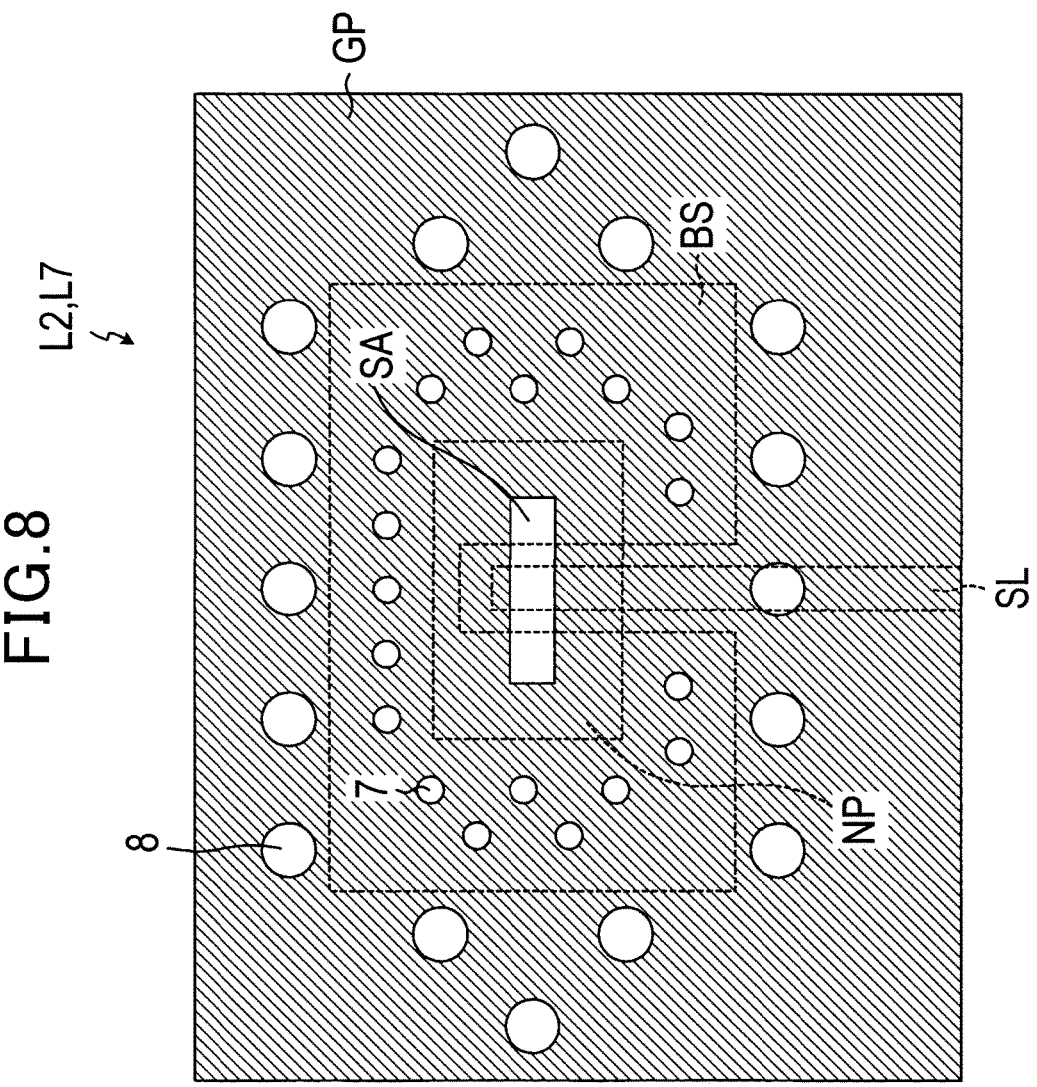
FIG. 8 is an explanatory diagram showing other structure in the vicinity of a waveguide formation section of an inner layer adjacent to the outer layer.

(1) According to the above-described embodiment, the resonant patches PT are formed in the inner layers L2 and L7. However, as shown in FIG. 8, a slot antenna SA may be formed instead of the resonant patch PT. The slot antenna SA has broadband characteristics, even having bit larger loss, compared to the resonant patch PT.

(2) According to the above-described embodiment, specific numerical data are given for the diameter of the via, the intervals of the vias, and the distance from the waveguide formation section NP. It is not limited to these data. However, these values can be appropriately optimized to obtain desired characteristics.

Figure 7:
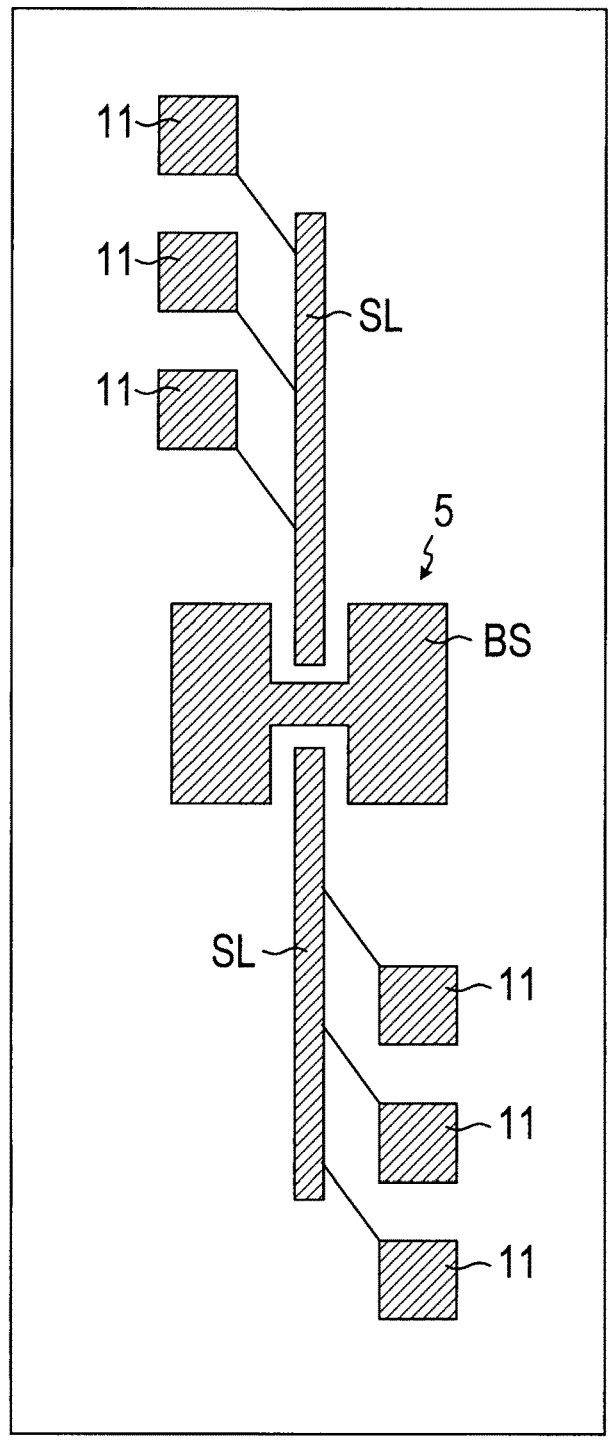
FIG. 7 is an explanatory diagram showing a configuration example of the outer layer.

(3) According to the above-described embodiment, the converter section 5 is configured such that the signal is received and outputted by a single microstrip line SL. However, for example, as shown in FIG. 7, two microstrip lines SL can be used to receive and output the signal. In this case, the microstrip line SL including the antenna element 11 may preferably be arranged to be symmetric with respect to the center of the opening of the pseudo waveguide 4.

(4) The elements of the present disclosure are conceptual, and not to limited to the above-described embodiments. For example, functions included in a single element may be distributed into a plurality of elements, or functions included in a plurality of elements may be integrated to a single element. Also, at least part of configurations in the above-described embodiments may be replaced to a known configuration having similar functions. Further, at least part of configurations in the above-described embodiments may be added to other configurations in the above-described embodiments, or may replace other configurations in the above-described embodiments.

REFERENCE SIGNS LIST

1: antenna apparatus
3: collective lamination substrate
4: pseudo waveguide
5: converter section
7: first via group
8: second via group
11: antenna element
12: circuit element
BS: back short
GP: ground pattern
L1-L8: pattern layer
NP: waveguide formation section
PT: resonant patch
SL: microstrip line

The invention claimed is:

1. A collective lamination substrate comprises:
pattern layers laminated in N-layers, where N is an integer and 4 or more, each of the pattern layers being laminated alternately with a dielectric layer;
a pseudo waveguide formed penetrating through the pattern layers in a lamination direction in which the pattern layers are laminated;
a transmission line and a converter section which are formed in a first layer and Nth layer located at outermost layers of the pattern layers in the lamination direction, the converter section mutually converting between an electrical signal flowing through the transmission line and radio waves being transmitted and received via the pseudo waveguide;
ground patterns formed at portions from a second layer to an N−1 th layer in the pattern layers, at least covering a periphery of a waveguide formation section which is an electrical opening to form the pseudo waveguide;
antennas formed at portions corresponding to the second and the N−1 th layers in the waveguide formation section;
a first via group provided in a periphery of the waveguide formation section, composed of a plurality of vias that establish conduction between a ground pattern formed in the first layer of the pattern layers and a ground pattern formed in the second layer of the pattern layers, and a plurality of vias that establish conduction between a ground pattern formed in the N−1 th layer of the pattern layers and a ground pattern formed in an N th layer of the pattern layers; and
a second via group provided in a periphery of the waveguide formation section and positioned at a more outer portion than the first via group, the second via group being composed of a plurality of vias that make conduction through the ground patterns formed at the portions from the second layer to the N−1 th layer.

2. The collective lamination substrate according to claim 1, wherein each of the antennas is configured of a resonant patch or a slot.

3. The collective lamination substrate according to claim 1, wherein each of the vias composing the first via group has a via diameter smaller than that of the vias composing the second via group.

4. The collective lamination substrate according to claim 1, wherein each of intervals of the vias composing the first via group is narrower than that of the vias composing the second via group.

5. The collective lamination substrate according to claim 1, wherein at least one of the vias composing the first via group and the vias composing the second via group is arranged to be located at a center line along an edge of the waveguide formation section, the center line passing through a center of the waveguide formation section.

6. The collective lamination substrate according to claim 1, wherein an antenna element is formed on either one of the first layer or the Nth layer of the pattern layers, and the transmission line is used as a supply line of the antenna element.

7. The collective lamination substrate according to claim 6, wherein the transmission line used for the supply line is two in number, and the two transmission lines are arranged symmetrically with respect to a center of a portion facing the waveguide formation section.

* * * * *